(12) United States Patent
Patil et al.

(10) Patent No.: US 12,428,753 B2
(45) Date of Patent: Sep. 30, 2025

(54) LIFT ASSEMBLIES, AND RELATED METHODS AND COMPONENTS, FOR SUBSTRATE PROCESSING CHAMBERS

(71) Applicant: Applied Materials, Inc., Santa Clara, CA (US)

(72) Inventors: Aniketnitin Patil, San Jose, CA (US); Raja Murali Dhamodharan, Madurai (IN); Martin Jeffrey Salinas, San Jose, CA (US); Shu-Kwan Lau, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 373 days.

(21) Appl. No.: 18/106,155

(22) Filed: Feb. 6, 2023

(65) Prior Publication Data
US 2024/0198468 A1     Jun. 20, 2024

(30) Foreign Application Priority Data
Dec. 14, 2022   (IN) ............................. 202241072228

(51) Int. Cl.
    *C30B 35/00*        (2006.01)
    *H01L 21/687*      (2006.01)

(52) U.S. Cl.
    CPC ...... *C30B 35/005* (2013.01); *H01L 21/68742* (2013.01)

(58) Field of Classification Search
    CPC ......... H01L 21/67745; H01L 21/67739; H01L 21/68785; H01L 21/68764;
(Continued)

(56) References Cited

U.S. PATENT DOCUMENTS

| 8,673,081 B2 | 3/2014 | Sivaramakrishnan et al. |
| 9,570,330 B2 | 2/2017 | Hofmeister et al. |

(Continued)

FOREIGN PATENT DOCUMENTS

| CN | 111725114 A | 9/2020 |
| CN | 113990780 A | 1/2022 |

(Continued)

OTHER PUBLICATIONS

International Search Report and Written Opinion dated Feb. 7, 2024 for Application No. PCT/US2023/035453.

*Primary Examiner* — Kaitlin S Joerger
(74) *Attorney, Agent, or Firm* — Patterson + Sheridan, LLP

(57) ABSTRACT

The present disclosure relates to lift assemblies, and related methods and components, for substrate processing chambers. In one implementation, a lift assembly for disposition in relation to a substrate processing chamber includes a first motor, a first drive assembly coupled to the first motor, and a first support block coupled to the first drive assembly. The first motor is configured to linearly move the first support block using the first drive assembly. The lift assembly includes a second motor, a second drive assembly coupled to the second motor, and a second support block coupled to the second drive assembly. The second motor is configured to linearly move the second support block using the second drive assembly, and the second motor is configured to linearly move the second support block independently of the first motor linearly moving the first support block.

19 Claims, 10 Drawing Sheets

(58) Field of Classification Search
CPC ........... H01L 21/68771; H01L 21/6875; H01L 21/68742; C30B 35/005
See application file for complete search history.

(56) References Cited

U.S. PATENT DOCUMENTS

| | | | |
|---|---|---|---|
| 9,620,395 | B2 | 4/2017 | Yang et al. |
| 9,640,416 | B2 | 5/2017 | Arai |
| 9,871,350 | B2 | 1/2018 | McLaurin et al. |
| 9,875,895 | B2 | 1/2018 | Yang et al. |
| 9,960,068 | B1* | 5/2018 | Konkola ............. C23C 16/4586 |
| 10,161,036 | B2 | 12/2018 | Hyon et al. |
| 10,392,702 | B2 | 8/2019 | Jung et al. |
| 10,741,396 | B2 | 8/2020 | Jung et al. |
| 10,755,955 | B2 | 8/2020 | Ishii et al. |
| 10,770,336 | B2* | 9/2020 | Hill ......................... C30B 25/08 |
| 10,870,922 | B2 | 12/2020 | Konkola et al. |
| 10,903,625 | B2 | 1/2021 | McLaurin et al. |
| 11,111,580 | B2 | 9/2021 | Kang et al. |
| 11,117,265 | B2* | 9/2021 | Wirth ................ H01L 21/68771 |
| 11,335,587 | B2 | 5/2022 | Ota et al. |
| 2004/0177813 | A1* | 9/2004 | Schieve ............ H01L 21/68742 118/728 |
| 2004/0179933 | A1* | 9/2004 | Huang ............. H01L 21/68792 414/217 |
| 2013/0287529 | A1* | 10/2013 | Yang ................. H01L 21/68742 269/14 |
| 2014/0105709 | A1* | 4/2014 | Abarra ................ H01L 21/6719 414/222.01 |
| 2018/0218929 | A1* | 8/2018 | Kikai ................... H01L 21/0271 |
| 2018/0315626 | A1 | 11/2018 | Franklin |
| 2019/0252229 | A1* | 8/2019 | Ishii ................... H01L 21/67742 |
| 2020/0105573 | A1* | 4/2020 | Schaller ............ H01L 21/68742 |
| 2021/0008727 | A1* | 1/2021 | Wirth ................ H01L 21/68764 |
| 2021/0028075 | A1 | 1/2021 | Zhu et al. |
| 2021/0324514 | A1 | 10/2021 | Ye et al. |
| 2022/0064790 | A1* | 3/2022 | Wada .................. H01L 21/67766 |
| 2022/0121196 | A1 | 4/2022 | Omori |
| 2022/0162751 | A1 | 5/2022 | Haanstra et al. |
| 2022/0170156 | A1 | 6/2022 | Jdira et al. |
| 2022/0181193 | A1 | 6/2022 | Gao et al. |
| 2022/0189804 | A1 | 6/2022 | Luan et al. |
| 2022/0199397 | A1* | 6/2022 | Wada ................... C23C 16/4401 |
| 2022/0199444 | A1 | 6/2022 | Oosterlaken et al. |
| 2022/0254668 | A1 | 8/2022 | Oosterlaken et al. |
| 2022/0268520 | A1 | 8/2022 | Oosterlaken et al. |
| 2022/0298643 | A1 | 9/2022 | Kajbafvala et al. |
| 2022/0298672 | A1 | 9/2022 | M'Saad et al. |
| 2022/0301829 | A1 | 9/2022 | Yoshikawa |
| 2022/0301905 | A1 | 9/2022 | Ye et al. |
| 2022/0301906 | A1 | 9/2022 | Naik et al. |
| 2022/0352006 | A1 | 11/2022 | Huang et al. |
| 2022/0359246 | A1 | 11/2022 | Umeoka |
| 2023/0265580 | A1* | 8/2023 | Okabe ...................... C23C 16/46 117/98 |
| 2023/0343615 | A1* | 10/2023 | Agarwal ........... H01L 21/68742 |
| 2024/0326187 | A1* | 10/2024 | Patil .................. H01L 21/68764 |

FOREIGN PATENT DOCUMENTS

| | | |
|---|---|---|
| CN | 111893567 B | 2/2022 |
| CN | 114000192 A | 2/2022 |
| CN | 111254487 B | 3/2022 |
| CN | 114138030 A | 3/2022 |
| CN | 114158145 A | 3/2022 |
| CN | 114351249 A | 4/2022 |
| CN | 216357351 U | 4/2022 |
| CN | 110854044 B | 5/2022 |
| CN | 111235551 B | 5/2022 |
| CN | 114481311 A | 5/2022 |
| CN | 114540947 A | 5/2022 |
| CN | 114540948 A | 5/2022 |
| CN | 114551331 A | 5/2022 |
| CN | 114613703 A | 6/2022 |
| CN | 114743924 A | 7/2022 |
| CN | 114823428 A | 7/2022 |
| CN | 114855272 A | 8/2022 |
| CN | 114883221 A | 8/2022 |
| CN | 114914181 A | 8/2022 |
| CN | 114927450 A | 8/2022 |
| CN | 115020281 A | 9/2022 |
| CN | 115101432 A | 9/2022 |
| CN | 115101443 A | 9/2022 |
| CN | 115101470 A | 9/2022 |
| CN | 115233303 A | 10/2022 |
| CN | 115235257 A | 10/2022 |
| CN | 115274510 A | 11/2022 |
| CN | 115312432 A | 11/2022 |
| CN | 115404543 A | 11/2022 |
| KR | 20080081823 A | 9/2008 |

\* cited by examiner

LIFT ASSEMBLIES, AND RELATED METHODS AND COMPONENTS, FOR SUBSTRATE PROCESSING CHAMBERS

CROSS-REFERENCE TO RELATED APPLICATIONS

This application claims priority to India provisional patent application serial number 202241072228, filed Dec. 14, 2022, which is herein incorporated by reference in its entirety.

BACKGROUND

Field

The present disclosure relates to lift assemblies, and related methods and components, for substrate processing chambers. In one or more embodiments, a lift assembly can be used to independently move lift pin(s) and substrate support(s).

Description of the Related Art

Semiconductor substrates are processed for a wide variety of applications, including the fabrication of integrated devices and microdevices. However, operations (such as epitaxial deposition operations) can be long, expensive, and inefficient, and can have limited capacity and throughput. Moreover, hardware can involve relatively large dimensions that occupy higher footprints in manufacturing facilities. For example, movement of certain components may be limited by other components during substrate transfer operations. As an example, it may be unfeasible to move two components simultaneously at a given point in time. As another example, it may unfeasible at a given point in time to move a first component without first moving a second component. Such limitations of movement may cause extraneous movement or delays in movement, which can affect processing time and throughput.

Such hindrances can be exacerbated in relatively complex processing operations, such as batch epitaxial processing.

Therefore, a need exists for improved apparatuses and methods in semiconductor processing.

SUMMARY

The present disclosure relates to lift assemblies, and related methods and components, for substrate processing chambers. In one or more embodiments, a lift assembly can be used to independently move lift pin(s) and substrate support(s).

In one implementation, a lift assembly for disposition in relation to a substrate processing chamber includes a first motor, a first drive assembly coupled to the first motor, and a first support block coupled to the first drive assembly. The first motor is configured to linearly move the first support block using the first drive assembly. The lift assembly includes a second motor, a second drive assembly coupled to the second motor, and a second support block coupled to the second drive assembly. The second motor is configured to linearly move the second support block using the second drive assembly, and the second motor is configured to linearly move the second support block independently of the first motor linearly moving the first support block.

In one implementation, an apparatus for substrate processing, includes a chamber body that includes a processing volume, a plurality of gas inject passages formed in the chamber body, and one or more gas exhaust passages formed in the chamber body. The apparatus includes one or more heat sources configured to generate heat, and a substrate support assembly positioned in the processing volume. The substrate support assembly includes a plurality of lift pins, one or more substrate supports, a first support frame, and a second support frame. The first support frame includes a first shaft and a plurality of first arms, and the plurality of first arms are configured to interface with the plurality of lift pins. The second support frame includes a second shaft and a plurality of second arms, and the plurality of second arms are configured to support the one or more substrate supports. The apparatus includes a lift assembly. The lift assembly includes a first motor, and a first support block coupled to the first motor and the first shaft of the first support frame. The first motor is configured to linearly move the first support block and the first support frame. The lift assembly includes a second motor, and a second support block coupled to the second motor and the second shaft of the second support frame. The second motor is configured to linearly move the second support block and the second support frame independently of the first motor linearly moving the first support block and the first support frame.

In one implementation, a method of transferring substrates includes moving a first substrate into a chamber, and raising a second support frame relative to a first support frame to engage the first substrate. The first support frame includes a first shaft and a plurality of first arms, and the second support frame includes a second shaft and a plurality of second arms. The method includes lowering the second support frame relative to the first support frame to land the first substrate on a first substrate support, raising the first support frame, and moving a second substrate into the chamber. The method includes raising the second support frame relative to the first support frame to engage the second substrate, and lowering the second support frame relative to the first support frame to land the second substrate on a second substrate support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to lift assemblies, and related methods and components, for substrate processing chambers. In one or more embodiments, a lift assembly can be used to independently move lift pin(s) and substrate support(s).

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
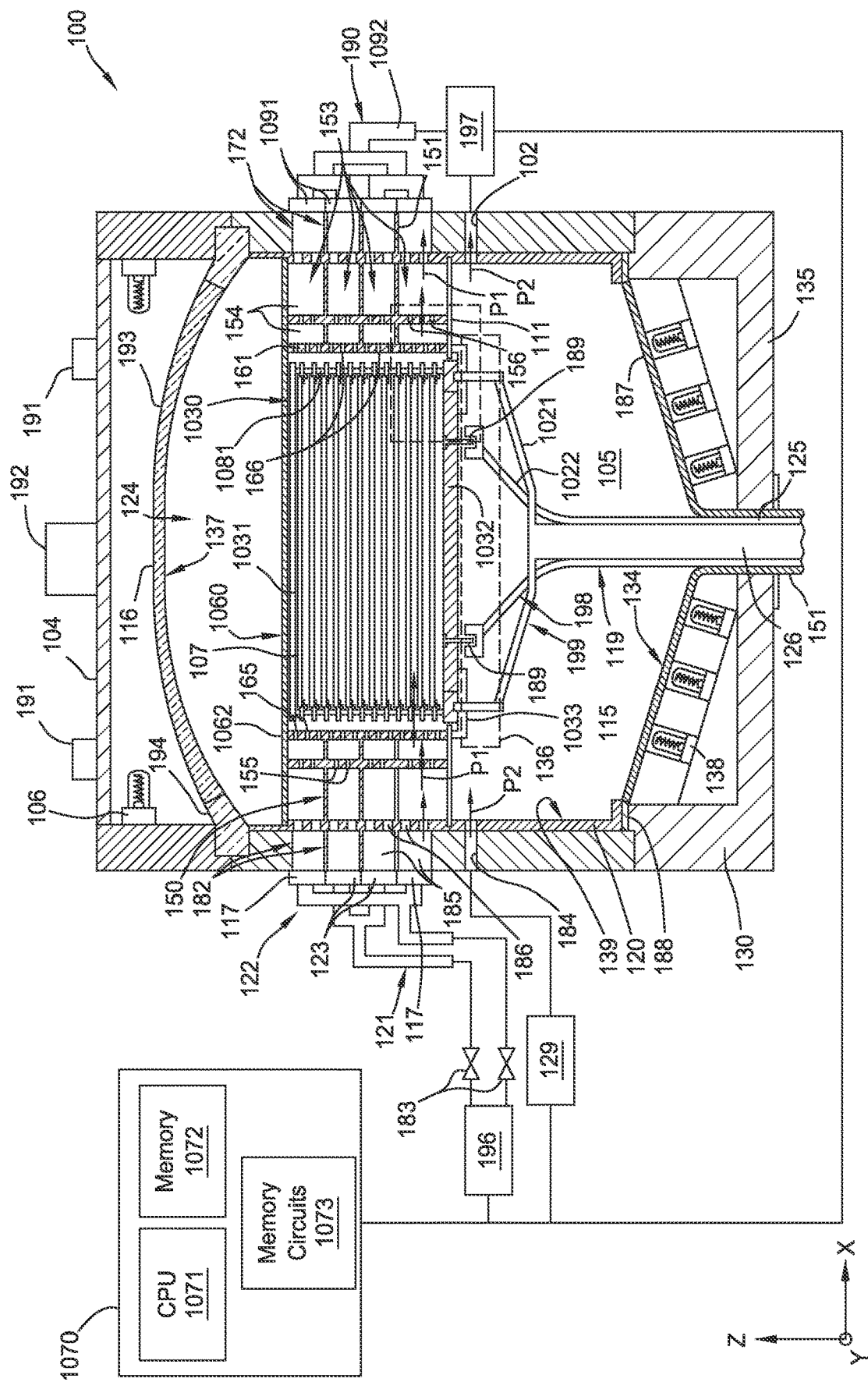
FIG. 1 is a schematic cross-sectional side view of a processing apparatus, according to one implementation.
Figure 2:
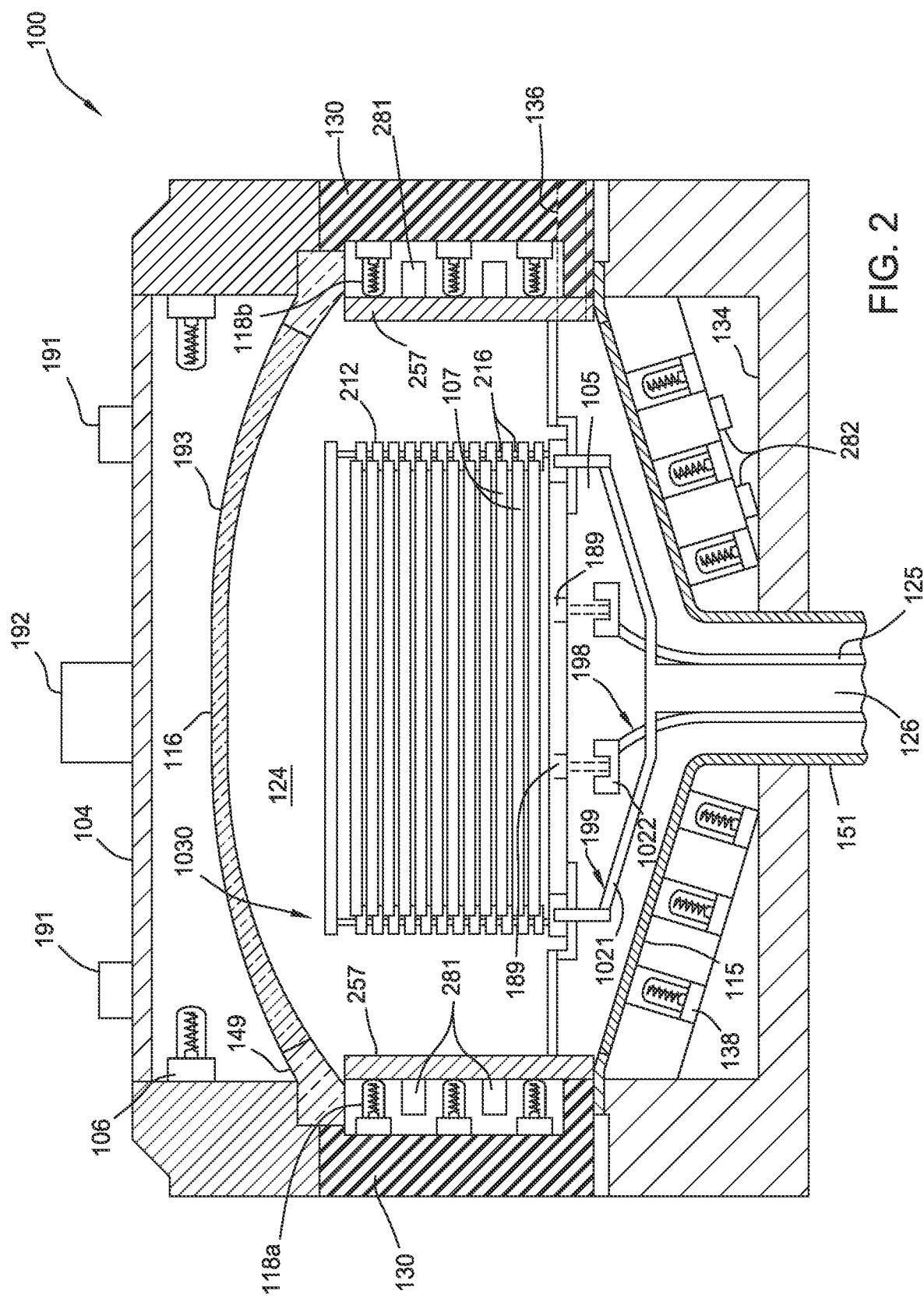
FIG. 2 is a schematic cross-sectional side view of the processing apparatus shown in FIG. 1, according to one implementation.

FIG. 1 is a schematic cross-sectional side view of a processing apparatus 100, according to one implementation. The side heat sources 118a, 118b shown in FIG. 2 are not shown in FIG. 1 for visual clarity purposes. The processing apparatus 100 includes a processing chamber having a chamber body 130 that defines a processing volume 124.

A cassette 1030 is positioned in the processing volume 124 and at least partially supported by a substrate support assembly 119 (such as a pedestal assembly). The cassette 1030 is positioned inwardly of the first shield plate 161. The cassette 1030 includes a first cassette plate 1032, a second cassette plate 1031 spaced from the first cassette plate 1032, and a plurality of levels that support a plurality of substrates 107 for simultaneous processing (e.g., epitaxial deposition). In the implementation shown in FIG. 1, the cassette 1030 supports twelve substrates. The cassette 1030 can support other numbers of substrates, including but not limited to two substrates 107, three substrates 107, six substrates 107, or eight substrates 107.

The processing apparatus 100 includes an upper window 116, such as a dome, disposed between a lid 104 and the processing volume 124. The processing apparatus 100 includes a lower window 115 disposed below the processing volume 124. One or more upper heat sources 106 are positioned above the processing volume 124 and the upper window 116. The one or more upper heat sources 106 can be radiant heat sources such as lamps, for example halogen lamps. The one or more upper heat sources 106 are disposed between the upper window 116 and the lid 104. The upper heat sources 106 are positioned to provide uniform heating of the substrates 107. One or more lower heat sources 138 are positioned below the processing volume 124 and the lower window 115. The one or more lower heat sources 138 can be radiant heat sources such as lamps, for example halogen lamps. The lower heat sources 138 are disposed between the lower window 115 and a floor 134 of the processing volume 124. The lower heat sources 138 are positioned to provide uniform heating of the substrates 107.

The present disclosure contemplates that other heat sources may be used (in addition to or in place of the lamps) for the various heat sources described herein. For example, resistive heaters, light emitting diodes (LEDs), and/or lasers may be used for the various heat sources described herein.

The upper and lower windows 116, 115 may be transparent to the infrared radiation, such as by transmitting at least 95% of infrared radiation. The upper and lower windows 116, 115 may be a quartz material (such as a transparent quartz). In one or more embodiments, the upper window 116 includes an inner window 193 and outer window supports 194. The inner window 193 may be a thin quartz window that partially defines the processing volume 124. The outer window supports 194 support the inner window 193 and are at least partially disposed within a support groove. In one or more embodiments, the lower window 115 includes an inner window 187 and outer window supports 188. The inner window 187 may be a thin quartz window that partially defines the processing volume 124. The outer window supports 188 support the inner window 187.

The substrate support assembly 119 is disposed in the processing volume 124. One or more liners 120 are disposed in the processing volume 124 and surround the substrate support assembly 119. The one or more liners 120 facilitate shielding the chamber body 130 from processing chemistry in the processing volume 124. The chamber body 130 is disposed at least partially between the upper window 116 and the lower window 115. The one or more liners 120 are disposed between the processing volume 124 and the chamber body 130.

The processing apparatus 100 includes a plurality of gas inject passages 182 formed in the chamber body 130 and in fluid communication with the processing volume 124, and one or more gas exhaust passages 172 (a plurality is shown in FIG. 1) formed in the chamber body 130 opposite the plurality of gas inject passages 182. The one or more gas exhaust passages 172 are in fluid communication with the processing volume 124. Each of the plurality of gas inject passages 182 and one or more gas exhaust passages 172 are formed through one or more sidewalls of the chamber body 130 and through one or more liners 120 that line the one or more sidewalls of the chamber body 130.

Each gas inject passage 182 includes a gas channel 185 formed in the chamber body 130 and one or more gas openings 186 (two and three are shown in FIG. 1) formed in the one or more liners 120. One or more supply conduit systems are in fluid communication with the gas inject passages 182. In FIG. 1, an inner supply conduit system 121 and an outer supply conduit system 122 are in fluid communication with the gas inject passages 182. The inner supply conduit system 121 includes a plurality of inner gas boxes 123 mounted to the chamber body 130 and in fluid communication with an inner set of the gas inject passages 182. The outer supply conduit system 122 includes a plurality of outer gas boxes 117 mounted to the chamber body 130 and in fluid communication with an outer set of the gas inject passages 182. The present disclosure contemplates that a variety of gas supply systems (e.g., supply conduit system(s), gas inject passages, and/or gas boxes different than what is shown in FIG. 1) may be used.

The processing apparatus 100 includes a flow guide structure 150 positioned in the processing volume 124. The flow guide structure 150 divides the processing volume into a plurality of flow levels 153 (four flow levels are shown in FIG. 1). In one or more embodiments, the flow guide structure 150 includes at least three flow levels 153 and a plurality of flow sections 154 (two flow sections 154 are shown for each flow level 153 in FIG. 1). The plurality of gas inject passages are 182 positioned as a plurality of inject levels such that each gas inject passage 182 corresponds to one of the plurality of inject levels. Each inject level aligns with a respective flow level 153. The processing apparatus 100 includes a heat shield structure 1060 positioned in the processing volume 124. The heat shield structure 1060 includes a first shield plate 161 and a second shield plate 1062.

The flow guide structure 150 includes a plurality of divider inlet openings 155 and a plurality of divider outlet openings 156 formed therein. The divider outlet openings 156 are opposite of the divider inlet openings 155. The heat shield structure 1060 includes a plurality of shield inlet openings 165 and a plurality of shield outlet openings 166 formed therein. The flow guide structure 150 and/or the heat shield structure 1060 are formed of one or more of quartz (such as transparent quartz, e.g. clear quartz, or opaque quartz, e.g. black quartz), silicon carbide (SiC), or graphite coated with SiC.

The cassette 1030 is positioned inwardly of the first shield plate 161. A pre-heat ring 111 is positioned outwardly of the cassette 1030. The pre-heat ring 111 is coupled to and/or at least partially supported by the one or more liners 120. Portions of the flow guide structure 150 may act as a pre-heat ring for all flow sections 154 of each flow level 153. The pre-heat ring 111 may be part of (such as integrated with) the flow guide structure 150.

As described below, the present disclosure contemplates that the flow guide structure 150 and/or the heat shield structure 1060 can be omitted.

During operations (such as during an epitaxial deposition operation), one or more process gases P1 are supplied to the processing volume 124 through the inner supply conduit system 121 and the outer supply conduit system 122, and through the plurality of gas inject passages 182. The one or more process gases P1 are supplied from one or more gas sources 196 in fluid communication with the plurality of gas inject passages 182. Each of the gas inject passages 182 is configured to direct the one or more processing gases P1 in a generally radially inward direction towards the cassette 1030. As such, in one or more embodiments, the gas inject passages 182 may be part of a cross-flow gas injector. The flow(s) of the one or more process gases P1 can be divided into a plurality of flow levels 153.

The processing apparatus 100 includes an exhaust conduit system 190. The one or more process gases P1 can be exhausted through exhaust gas openings formed in the one or more liners 120, exhaust gas channels formed in the chamber body 130, and then through exhaust gas boxes 1091. The one or more process gases P1 can flow from exhaust gas boxes 1091 and to an optional common exhaust box 1092, and then out through a conduit using one or more pump devices 197 (such as one or more vacuum pumps).

The one or more processing gases P1 can include, for example, purge gases, cleaning gases, and/or deposition gases. The deposition gases can include, for example, one or more reactive gases carried in one or more carrier gases. The one or more reactive gases can include, for example, silicon and/or germanium containing gases (such as silane ($SiH_4$), disilane ($Si_2H_6$), dichlorosilane ($SiH_2Cl_2$), and/or germane ($GeH_4$)), chlorine containing etching gases (such as hydrogen chloride (HCl)), and/or dopant gases (such as phosphine ($PH_3$) and/or diborane ($B_2H_6$)). The one or more purge gases can include, for example, one or more of argon (Ar), helium (He), nitrogen ($N_2$), hydrogen chloride (HCl), and/or hydrogen ($H_2$).

Purge gas P2 supplied from a purge gas source 129 is introduced to the bottom region 105 of the processing volume 124 through one or more purge gas inlets 184 formed in the sidewall of the chamber body 130.

The one or more purge gas inlets 184 are disposed at an elevation below the gas inject passages 182. If the one or more liners 120 are used, a section of the one or more liners 120 may be disposed between the gas inject passages 182 and the one or more purge gas inlets 184. The one or more purge gas inlets 184 are configured to direct the purge gas P2 in a generally radially inward direction. The one or more purge gas inlets 184 may be configured to direct the purge gas P2 in an upward direction. During a film formation process, the substrate support assembly 119 is located at a position that can facilitate the purge gas P2 to flow generally along a flow path across a back side of the cassette 1030. The purge gas P2 exits the bottom region 105 and is exhausted out of the processing apparatus 100 through one or more purge gas exhaust passages 102 located on the opposite side of the processing volume 124 relative to the one or more purge gas inlets 184.

The substrate support assembly 119 includes a first support frame 199 and a second support frame 198 disposed at least partially about the first support frame 199. The first support frame 199 includes arms coupled to the cassette 1030 such that lifting and lowering the first support frame 199 lifts and lowers the cassette 1030. A plurality of lift pins 189 are suspended from the cassette 1030. Lowering of the cassette 1030 and/or lifting of the second support frame 198 initiates contact of the lift pins 189 with arms of the second support frame 198. Continued lowering of the cassette 1030 and/or lifting of the second support frame 198 initiates contact of the lift pins 189 with the substrates in the cassette 1030 such that the lift pins 189 raise the substrates in the cassette 1030. A bottom region 105 of the processing apparatus 100 is defined between the floor 134 and the cassette 1030.

A first shaft 126 of the first support frame 199, a second shaft 125 of the second support frame 198, and a section 151 of the lower window 115 extend through a port formed in a bottom 135 of the chamber body 130 and the floor 134. As described below, each shaft 125, 126 is coupled to one or more respective motors, which are configured to independently raise, lower, and/or rotate the cassette 1030 using the first support frame 199, and to independently raise and lower the lift pins 189 using the second support frame 198. The first support frame 199 includes the first shaft 126 and a plurality of first arms 1021 configured to support the cassette 1030 that includes one or more substrate supports 212. The second support frame 198 includes the second shaft 125 and a plurality of second arms 1022 configured to interface with and support the lift pins 189.

An opening 136 (a substrate transfer opening) is formed through the one or more sidewalls of the chamber body 130. The opening 136 may be used to transfer the substrates 107 to or from the cassette 1030, e.g., in and out of the processing volume 124. In one or more embodiments, the opening 136 includes a slit valve. In one or more embodiments, the opening 136 may be connected to any suitable valve that enables the passage of substrates therethrough. The opening 136 is shown in ghost in FIGS. 1 and 2 for visual clarity purposes.

The processing apparatus 100 may include one or more temperature sensors 191, 192, 282, such as optical pyrometers, which measure temperatures within the processing apparatus 100 (such as on the surfaces of the upper window 116, and/or one or more surfaces of the substrates 107, the heat shield structure 1060, and/or the cassette 1030). The one or more temperature sensors 191, 192 are disposed on the lid 104. The one or more temperature sensors 282 (e.g., lower pyrometers) are disposed on a lower side of the lower window 115. The one or more temperature sensors 282 can be disposed adjacent to and/or on the bottom 135 of the chamber body 130.

In one or more embodiments, upper temperature sensors 191, 192 are oriented toward a top of the cassette 1030 (such as an upper surface of the second cassette plate 1031. In one or more embodiments, side temperature sensors 281 are oriented toward the first shield plate 161 and/or substrate supports 212 of the cassette 1030. In one or more embodiments, lower temperature sensors 282 are oriented toward a bottom of the cassette 1030 (such as a lower surface of the first cassette plate 1032.

The processing apparatus 100 includes a controller 1070 configured to control the processing apparatus 100 or components thereof. For example, the controller 1070 may control the operation of components of the processing apparatus 100 using a direct control of the components or by controlling controllers associated with the components. In operation, the controller 1070 enables data collection and feedback from the respective chambers to coordinate and control performance of the processing apparatus 100.

The controller 1070 generally includes a central processing unit (CPU) 1071, a memory 1072, and support circuits 1073. The CPU 1071 may be one of any form of a general purpose processor that can be used in an industrial setting. The memory 1072, or non-transitory computer readable medium, is accessible by the CPU 1071 and may be one or more of memory such as random access memory (RAM), read only memory (ROM), floppy disk, hard disk, or any other form of digital storage, local or remote. The support circuits 1073 are coupled to the CPU 1071 and may include cache, clock circuits, input/output subsystems, power supplies, and the like.

The various methods (such as the method 700) and operations disclosed herein may generally be implemented under the control of the CPU 1071 by the CPU 1071 executing computer instruction code stored in the memory 1072 (or in memory of a particular processing chamber) as, e.g., a software routine. When the computer instruction code is executed by the CPU 1071, the CPU 1071 controls the components of the processing apparatus 100 to conduct operations in accordance with the various methods and operations described herein. In one embodiment, which can be combined with other embodiments, the memory 1072 (a non-transitory computer readable medium) includes instructions stored therein that, when executed, cause the methods (such as the method 700) and operations (such as the operations 702-734) described herein to be conducted. The controller 1070 can be in communication with the heat sources, the gas sources, and/or the vacuum pump(s) of the processing apparatus 100, for example, to cause a plurality of operations to be conducted. The controller 1070 can control the lift assembly 300 described below. The controller 1070 can control, for example, the motors 310, 340, 370 described below to conduct at least part of the method 700.

FIG. 2 is a schematic cross-sectional side view of the processing apparatus 100 shown in FIG. 1, according to one implementation. The cross-sectional view shown in FIG. 2 is rotated by 55 degrees relative to the cross-sectional view shown in FIG. 1.

The processing apparatus 100 includes one or more side heat sources 118a, 118b (e.g., side lamps, side resistive heaters, side LEDs, and/or side lasers, for example) positioned outwardly of the processing volume 124. One or more second side heat sources 118b are opposite one or more first side heat sources 118a across the processing volume 124.

In FIG. 2, the flow guide structure 150 and the heat shield structure 1060 are not shown for visual clarity purposes. Additionally, the present disclosure contemplates that the flow guide structure 150 and/or the heat shield structure 1060 can be omitted from the processing apparatus 100 shown in FIGS. 1-2. In such an implementation, the one or more process gases P1 flow into an outer annulus of the processing volume 124 from the gas inject passages 182, and then flow into openings 216 between and outwardly of substrate supports 212 (e.g., arcuate supports) of the cassette 1030, and then into gaps between the substrates 107. The one or more process gases P1 flow out of the gaps, into the openings 216 (between and outwardly of substrate supports) on an exhaust side of the substrates 107, into the outer annulus of the processing volume 124, and into the one or more gas exhaust passages 172. The present disclosure also contemplates that a plurality of lines (such as conduits) in the processing volume 124 can connect each of the gas inject passages 182 to each of the inlet openings of the cassette 1030.

In addition to the one or more temperature sensors 191, 192 positioned above the processing volume 124 and above the second shield plate 1062, the processing apparatus 100 may include one or more temperature sensors 281, such as optical pyrometers, which measure temperatures within the processing apparatus 100 (such as on the surfaces of the upper window 116 and/or one or more surfaces of the substrates 107, the heat shield structure 1060, a plurality of windows 257, and/or the cassette 1030). The plurality of windows 257—if used—can be disposed in gaps between or formed in the one or more liners 120. The one or more temperature sensors 281 are side temperature sensors (e.g., side pyrometers) that are positioned outwardly of the processing volume 124, outwardly of the flow guide structure 150, and outwardly of the plurality of windows 257. The one or more temperature sensors 281 can be radially aligned, for example, with the plurality of windows 257 (as shown in FIG. 2).

The one or more side temperature sensors 281 (such as one or more pyrometers) can be used to measure temperatures within the processing volume 124 from respective sides of the processing volume 124. The side sensors 281 are arranged in a plurality of sensor levels (three sensor levels are shown in FIG. 2). In one or more embodiments, the number of sensor levels is equal to the number of heat source levels. Each side sensor 281 can be oriented horizontally or can be directed (e.g., oriented downwardly at an angle) toward the substrate 107 and the substrate support 212 of a respective level of the cassette 1030.

Figure 3:
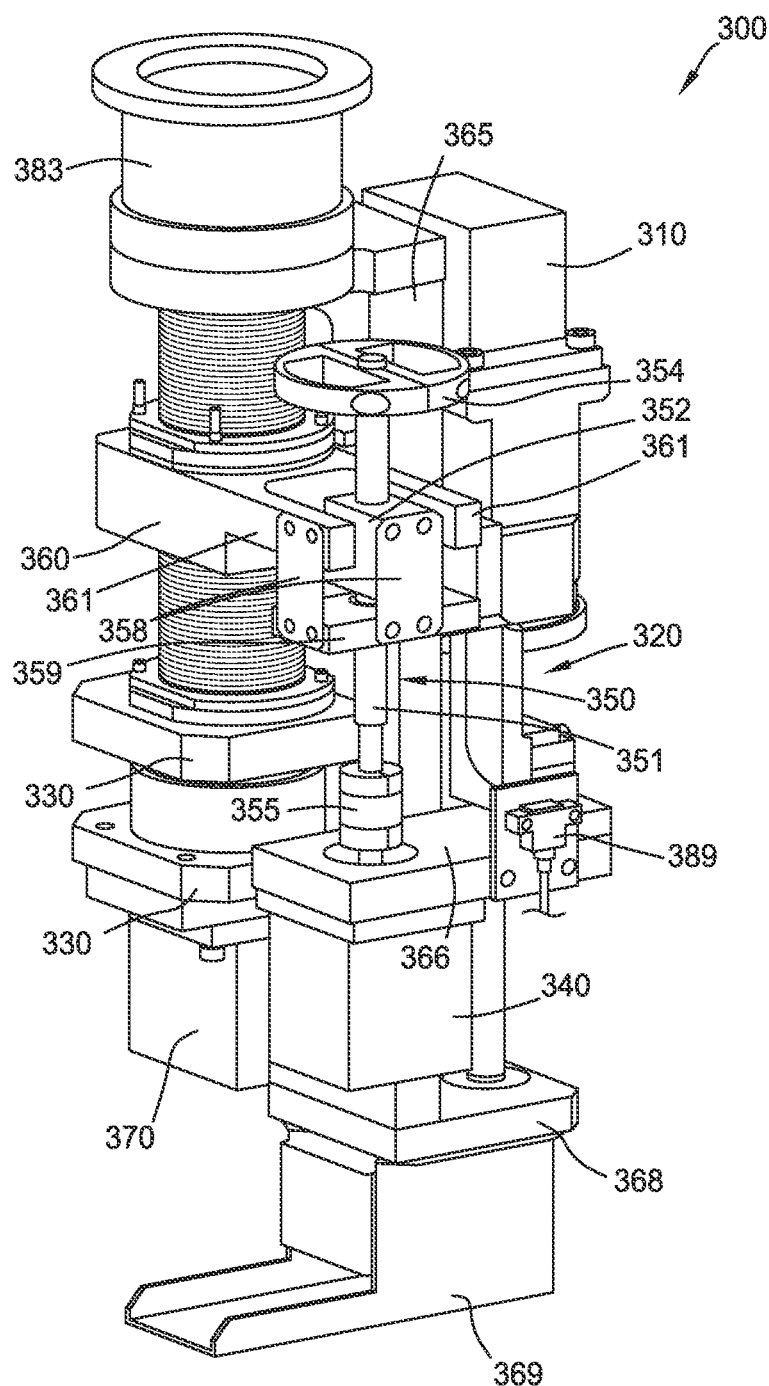
FIG. 3 is a partial schematic perspective front view of a first side of a lift assembly, according to one implementation.

FIG. 3 is a partial schematic perspective front view of a first side of a lift assembly 300, according to one implementation.

Figure 4:
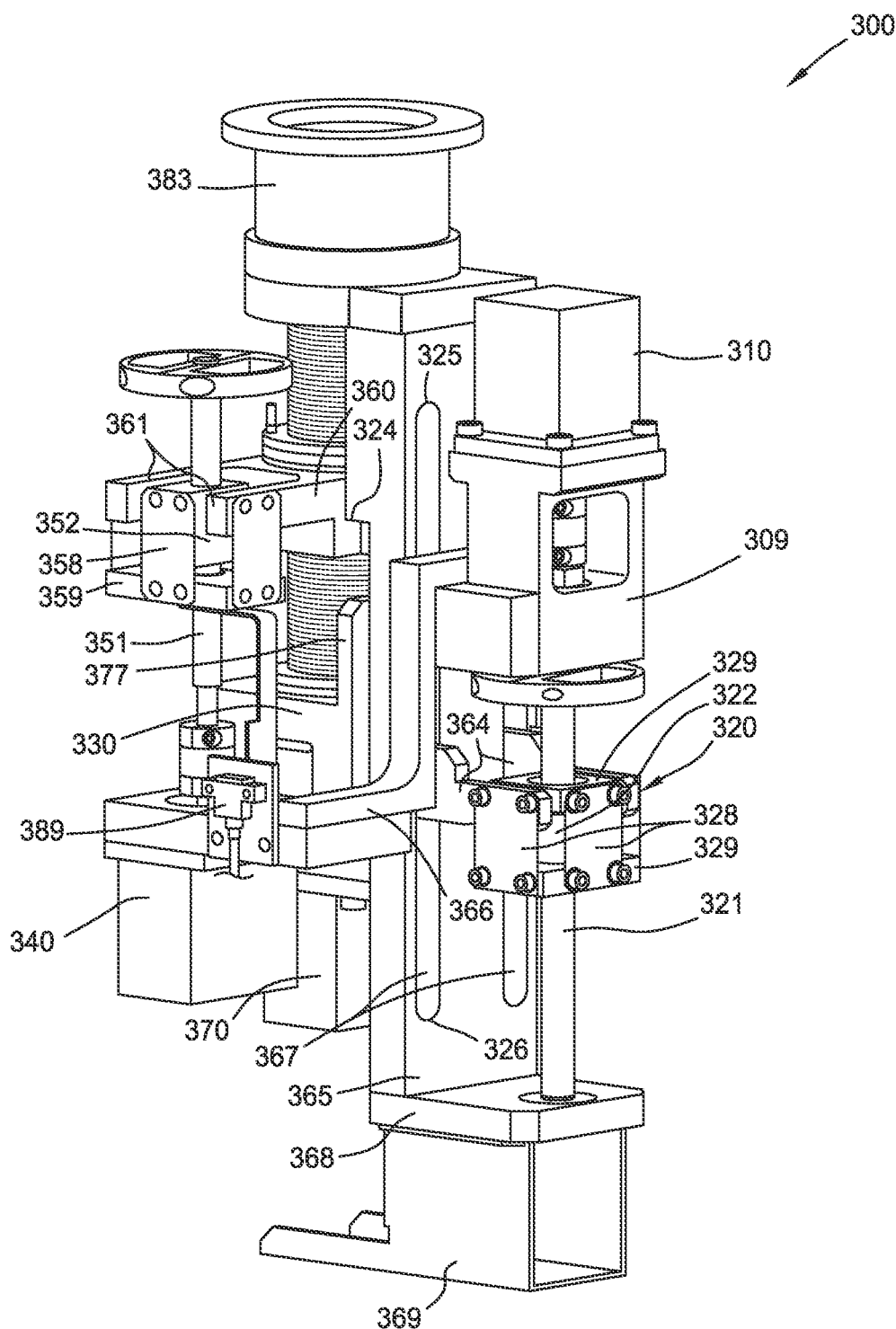
FIG. 4 is a partial schematic perspective back view of the first side of the lift assembly shown in FIG. 3, according to one implementation.

FIG. 4 is a partial schematic perspective back view of the first side of the lift assembly 300 shown in FIG. 3, according to one implementation.

Figure 5:
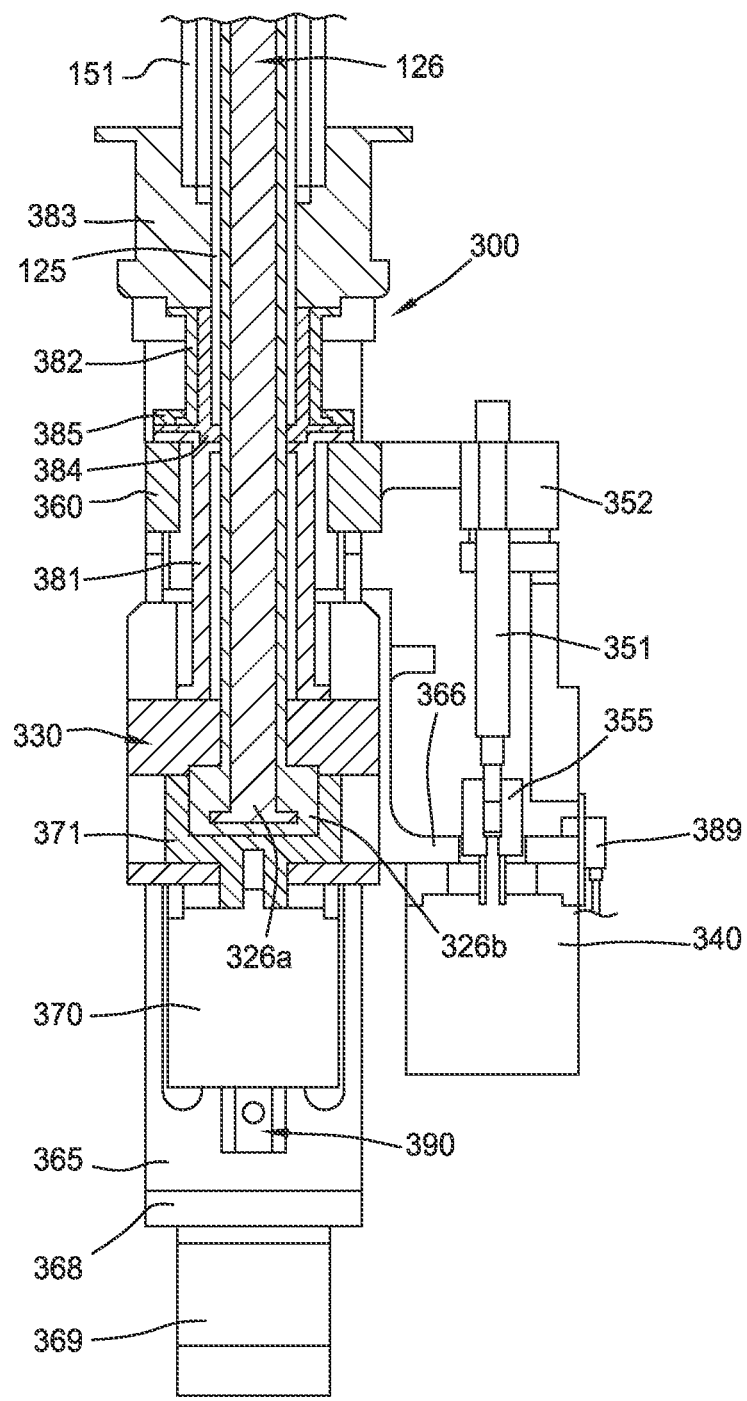
FIG. 5 is a partial schematic side cross-sectional view of the lift assembly shown in FIGS. 3 and 4, according to one implementation.

The lift assembly 300 is coupled the processing apparatus 100. For example, as shown in FIG. 5, the lift assembly 300 is coupled to the first shaft 126, the second shaft 125, and/or the section 151 of the lower window 115.

The lift assembly 300 includes a first motor 310, a first drive assembly 320 coupled to the first motor 310, and a first support block 330 (e.g., a first support bracket) coupled to the first drive assembly 320. The first motor 301 is mounted to a motor block 309. The first motor 310 is configured to linearly move the first support block 330 using the first drive assembly 320. The first drive assembly 320 includes a first drive shaft 321 coupled to the first motor 310, and a first traveling block 322 disposed along the first drive shaft 321. The first traveling block 322 is coupled to the first support block 330 and is configured to linearly move along the first drive shaft 321. In one or more embodiments, a plurality of plates 328, 329 are coupled to the first support block 330 and/or the first traveling block 322. The first motor 310 is configured to rotate the first drive shaft 321 to move the first traveling block 322 such that the first support block 330 moves with the first traveling block 322. In one or more embodiments, the first drive shaft 321 is a first lead screw, and a first threaded interface is between the first lead screw and the first traveling block 322 such that rotation of the first drive shaft 321 linearly moves the first traveling block 322 along the first drive shaft 321.

The lift assembly 300 includes a second motor 340, a second drive assembly 350 coupled to the second motor 340, and a second support block 360 coupled to the second drive assembly 350. The second motor 340 is configured to linearly move the second support block 360 using the second drive assembly 350. The second motor 340 is configured to linearly move the second support block 360 independently of the first motor 310 linearly moving the first support block 330. The second drive assembly 350 includes a second drive shaft 351 coupled to the second motor 340, and a second traveling block 352 disposed along the second drive shaft 351. The second traveling block 352 is coupled to the second support block 360 and is configured to linearly move along the second drive shaft 351. In one or more embodiments, the second traveling block 352 is coupled to the second support block 360 using a plurality of plates 358, 359. The second motor 340 is configured to rotate the second drive shaft 351 to move the second traveling block 352 such that the second support block 360 moves with the second traveling block 352. In one or more embodiments, the second drive shaft 351 is a second lead screw, and a second threaded interface is between the second lead screw and the second traveling block 352 such that rotation of the second drive shaft 351 linearly moves the second traveling block 352 along the second drive shaft 351.

The second drive assembly 350 includes one or more stops 354, 355 (such as a wheel and/or a barrel) disposed along the second drive shaft 351 to limit the linear movement of the second traveling block 352 (and the second support block 360).

The lift assembly 300 includes a support beam 365, and a mount block 366 coupled to the support beam 365. Each of the first motor 310 and the second motor 340 is coupled to the mount block 366. The motor block 309 can be coupled to the support beam 365 through the mount block 366, or the motor block 309 can be coupled directly to the support beam 365. The support beam 365 includes one or more tracks 367 interfacing with the first support block 330. In one or more embodiments, the one or more tracks 367 are one or more openings (e.g., apertures) formed in the support beam 365, and the first support block 330 includes one or more first legs 364 (such as two legs) that extend through the one or more tracks 367 and couple to the first traveling block 322. In one or more embodiments, the second support block 360 includes one or more second legs 361 that couple to the second traveling block 352.

One or more stops 324, 325, 326 (such as ledge(s) of the support beam 365 and/or end(s) of the one or more tracks 367) limit the linear movement of the first support block 330 (and the first traveling block 322). As an example, a front plate 377 of the first support block 330 can move to abut against a first stop 324. As another example, the first legs 364 of the first support block 330 can move between two stops 325, 326.

The support beam 365 is coupled to a base block 368, and the base block 368 is coupled to a base frame 369. The base frame 369 mounts the lift assembly 300 to a structure. For example, the base frame 369 can coupled to a mainframe of a cluster tool.

The lift assembly 300 includes a third motor 370 coupled to the first support block 330. In one or more embodiments, the third motor 370 linearly moves with the linear movement of the first support block 330.

FIG. 5 is a partial schematic side cross-sectional view of the lift assembly 300 shown in FIGS. 3 and 4, according to one implementation. Hatching is not shown for some components for visual clarity purposes. Each shaft 125, 126 can be integrally formed, or can include one or more components coupled together. In the implementation shown in FIG. 5, the first shaft 126 includes an inner rod 326a and an outer rod 326b. Each rod 326a, 326b can be integrally formed, or can include one or more components coupled together.

The first support block 330 supports the first shaft 126 of the first support frame 199 such that linear movement of the first support block 330 linearly moves the first support frame 199 to raise and/or lower the first support frame 199. Linear movement of the first traveling block 322 (which is driven by the first motor 310 rotating the first drive shaft 321) linearly moves the first support block 330 and the first support frame 199. In one or more embodiments, the first shaft 126 is coupled to the first support block 330 (e.g., using fasteners and/or interference fitting of overlapping shoulders).

The second support block 360 supports the second shaft 125 of the second support frame 198 such that linear movement of the second support block 360 linearly moves the second support frame 198 to raise and/or lower the second support frame 198. Linear movement of the second traveling block 352 (which is driven by the second motor 340 rotating the second drive shaft 351) linearly moves the second support block 360 and the second support frame 198. The second motor 340 is configured to linearly move (e.g., raise and/or lower) the second traveling block 352, the second support block 360, and the second support frame 198 independently of the first motor 310 linearly moving (e.g., raising and/or lowering) the first traveling block 322, the first support block 330, and the first support frame 199. In one or more embodiments, the second shaft 125 is coupled to the second support block 360 (e.g., using fasteners and/or interference fitting of overlapping shoulders).

The third motor 370 is configured to rotate the first shaft 126 of the first support frame 199 using a rotor 371 coupled to the first shaft 126. The rotor 371 and the first shaft 126 are configured to rotate within and relative to the first support block 330. The third motor 370 can rotate the first support frame 199 (and the substrate supports 212 and the substrates 107 of the cassette 1030 supported by the first support frame 199) during a deposition operation, such as an epitaxial deposition operation.

Each motor 310, 340, 370 can include, for example, an electric motor, such as a servo motor. Other motors are contemplated for each motor 310, 340, 370. The first and second motors, 340 can each be a rotary motor or a linear motor. The third motor 370 can be a rotary motor.

The lift assembly 300 includes one or more position sensors 389 that are configured to measure the vertical position of the first support frame 199 and/or the second support frame across a plurality of positions. The, plurality of positions can include, for example, the processing position, the transfer position, and a rotation initiation position for the first support frame 199. The one or more position sensors 389 are in communication with the controller 1070. When the one or more position sensors detect the rotation initiation position of the first support frame 199, the controller 1070 automatically instructs the third motor 370 to begin rotating the first support frame 199 (and the cassette 1030). The rotation initiation position is vertically between the processing position and the transfer position such that the first support frame 199 passes the rotation initiation position while raising from the transfer position and toward the processing position. The plurality of positions can include a home position between the rotation initiation position and the transfer position.

A first seal sleeve 381 is disposed between the first support block 330 and the second support block 360, and a second seal sleeve 382 is disposed between the second support block 360 and an end flange 383 of the lift assembly 300. The second shaft 125 interfaces with a shoulder of a support ring 384. A clamp ring 385 couples the support ring 384, the first seal sleeve 381, and the second seal sleeve 382 to the second support block 360. The clamp ring 385 can be fastened to the second support block 360 using one or more fasteners. Each of the first seal sleeve 381 and the second seal sleeve 382 can include a bellows, such as a bellows formed of a metallic material or a metallized material.

Figure 6:
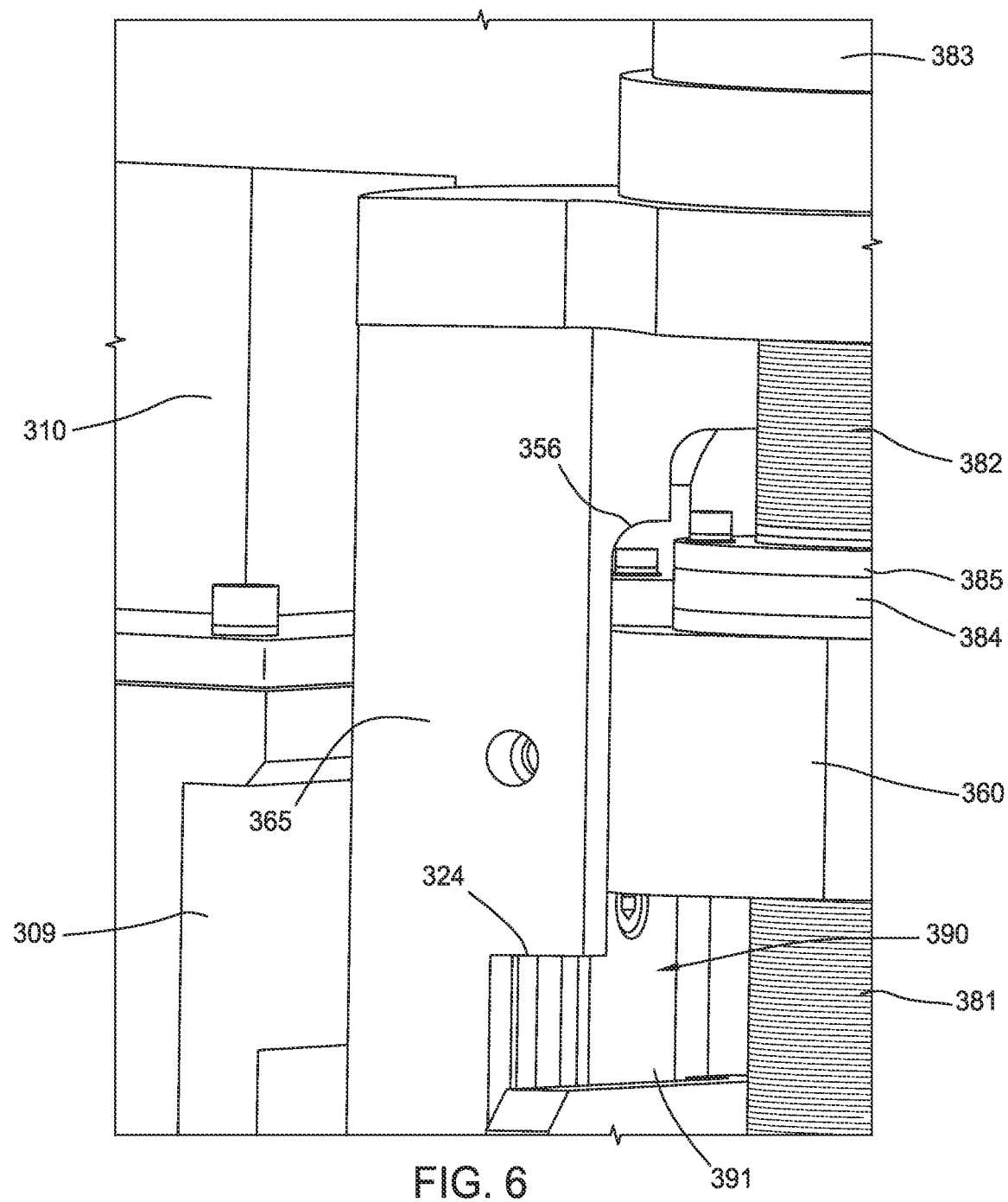
FIG. 6 is a partial schematic enlarged perspective front view of a second side of the lift assembly shown in FIGS. 3-5, according to one implementation.

FIG. 6 is a partial schematic enlarged perspective front view of a second side of the lift assembly 300 shown in FIGS. 3-5, according to one implementation.

One or more stops 356 (such as ledge(s) of the support beam 365) can limit the linear movement of the second support block 360. A track plate 390 can be coupled to the support beam 365. The track plate 390 includes one or more protrusions 391 that are received in one or more recesses of the first support block 330 and/or one or more recesses of the second support block 360 such that the first support block 330 and/or the second support block 360 can slide linearly along the track plate 390.

Figure 7A:
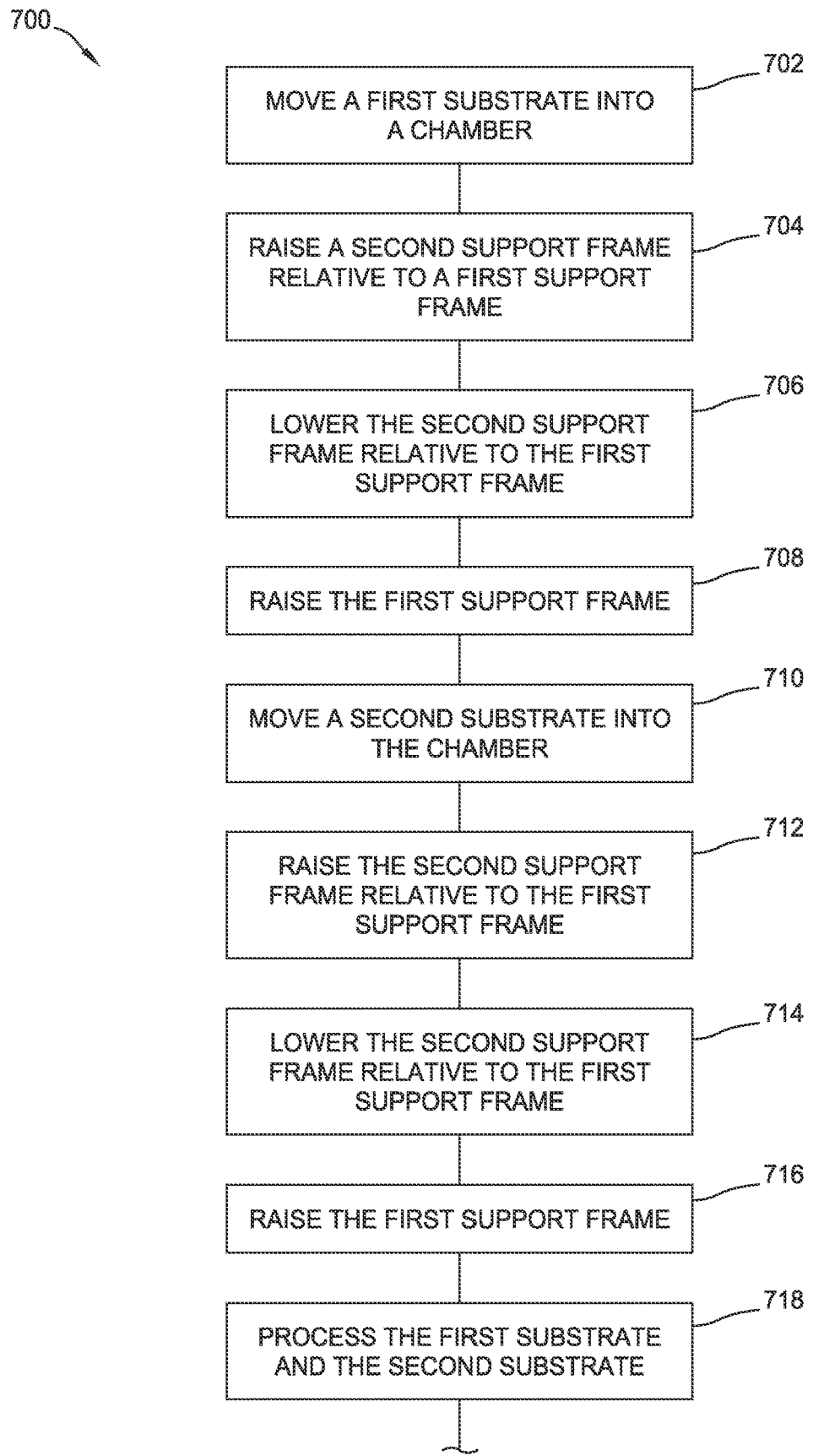
FIG. 7A is a schematic block diagram view of a method of transferring substrates, according to one implementation.

FIG. 7A is a schematic block diagram view of a method 700 of transferring substrates, according to one implementation.

Figure 7B:
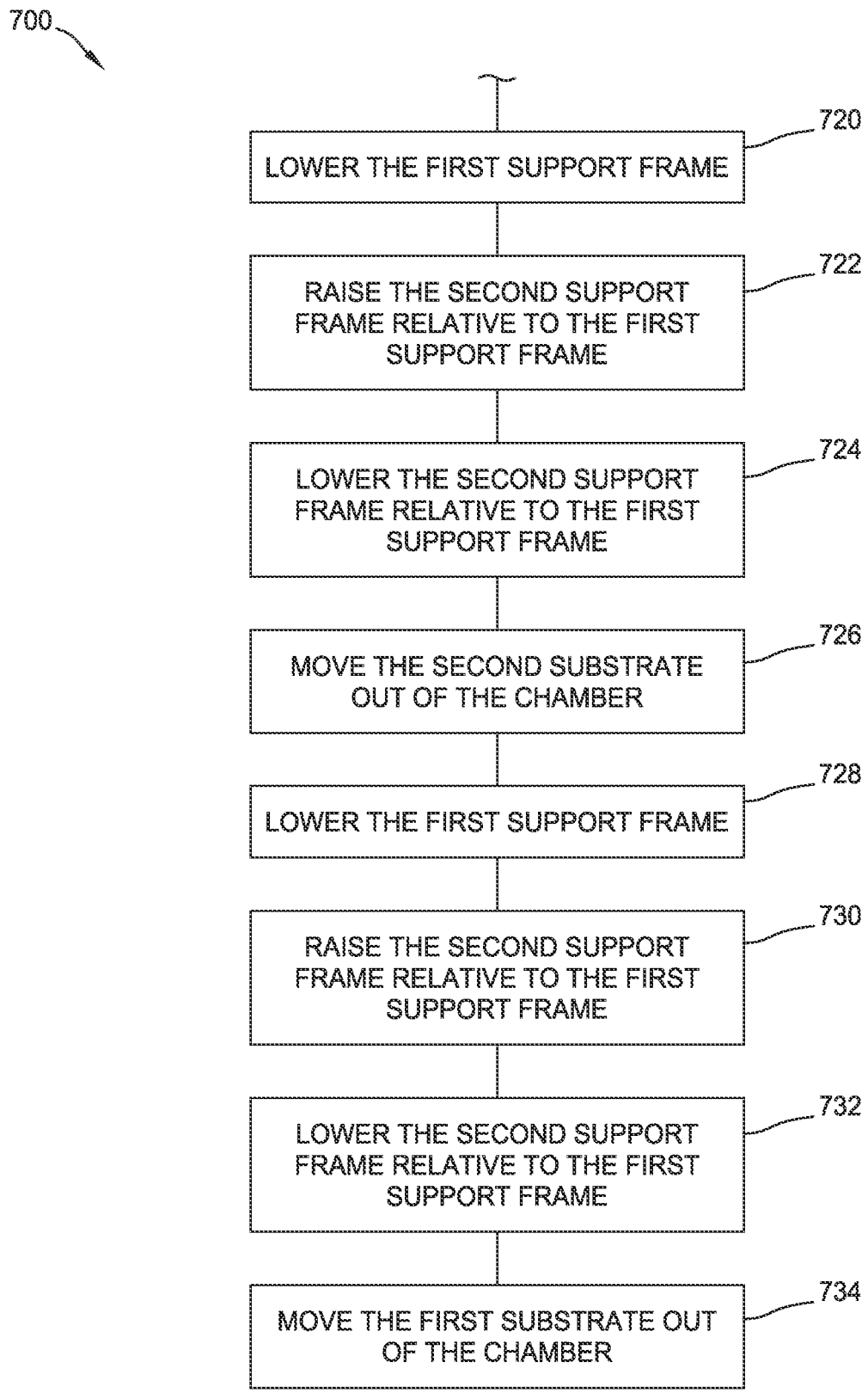
FIG. 7B is a schematic block diagram view of the continuation of the method shown in FIG. 7A, according to one implementation.

FIG. 7B is a schematic block diagram view of the continuation of the method 700 shown in FIG. 7A, according to one implementation.

Operation 702 includes moving a first substrate into a chamber (such as an epitaxial deposition chamber). The first substrate can be moved in the chamber, for example, through the transfer opening 136 and on a robot arm (such as on a robot blade of the robot arm).

Operation 704 includes raising a second support frame (such as the second support frame 198) relative to a first support frame (such as the first support frame 199) to engage the first substrate. The first support frame is positioned at a transfer position. The first support frame includes a first shaft and a plurality of first arms, and the second support frame includes a second shaft and a plurality of second arms. The raising can include engaging the first substrate and then lifting the first substrate from the robot arm. In one or more embodiments, the raising of the second support frame to engage the first substrate includes the plurality of second arms raising a plurality of lift pins that engage the first substrate.

Operation 706 includes lowering the second support frame relative to the first support frame to land the first substrate on a first substrate support. The first substrate support can be part of a cassette (such as the cassette 1030) supported by the first support frame.

Operation 708 includes raising the first support frame. In one or more embodiments, the first support frame is raised to align a second substrate support (which is positioned below the first substrate support) with the transfer opening 136. In one or more embodiments, the second support frame is raised at least partially simultaneously with the raising of the first support frame.

The present disclosure contemplates that operation 706 could be omitted, and the raising of operation 708 can engage the first substrate support with the first substrate to land the first substrate on the first substrate support.

Operation 710 includes moving a second substrate into the chamber.

Operation 712 includes raising the second support frame relative to the first support frame to engage the second substrate. The raising can include engaging the second substrate and then lifting the second substrate from the robot arm.

Operation 714 includes lowering the second support frame relative to the first support frame to land the second substrate on the second substrate support.

Operation 716 includes raising the first support frame into a processing position (such as the position of the cassette 1030 shown in FIG. 1).

Operation 718 includes processing the first substrate and the second substrate. In one or more embodiments, the processing includes epitaxially depositing one or more layers on each of the first substrate and the second substrate. The first support frame (and the cassette 1030 supported by the first support frame) can be rotated during the processing.

Operation 720 (shown in FIG. 7B) includes lowering the first support frame. The first support frame can be lowered back to the transfer position.

Operation 722 includes raising the second support frame relative to the first support frame to engage the second substrate. The raising can include engaging the second substrate (such as by using the lift pins) and lifting the second substrate from the second substrate support such that the robot arm can be positioned under the second substrate.

Operation 724 includes lowering the second support frame relative to the first support frame to disengage the second substrate (e.g., such that the second substrate lands on the robot arm and continued lowering of the lift pins disengages the lift pins from the second substrate).

Operation 726 includes moving the second substrate out of the processing chamber (e.g., on the robot arm).

Operation 728 includes lowering the first support frame. In one or more embodiments, the first support frame is raised to align the first substrate support with the transfer opening 136. In one or more embodiments, the second support frame is lowered at least partially simultaneously with the lowering of the first support frame.

Operation 730 includes raising the second support frame relative to the first support frame to engage the first substrate. The raising can include engaging the first substrate (such as by using the lift pins) and lifting the first substrate from the first substrate support such that the robot arm can be positioned under the first substrate.

Operation 732 includes lowering the second support frame relative to the first support frame to disengage the first substrate (e.g., such that the second first lands on the robot arm and continued lowering of the lift pins disengages the lift pins from the second substrate).

Operation 734 includes moving the first substrate out of the processing chamber (e.g., on the robot arm).

The method 700 can be conducted at least partially using the lift assembly 300 shown in FIGS. 3-5.

FIGS. 8A-8D show an operation flow (from a partial schematic side view) of transferring two substrates 107a, 107B onto a cassette in a processing chamber, according to one implementation.

Figure 8A:
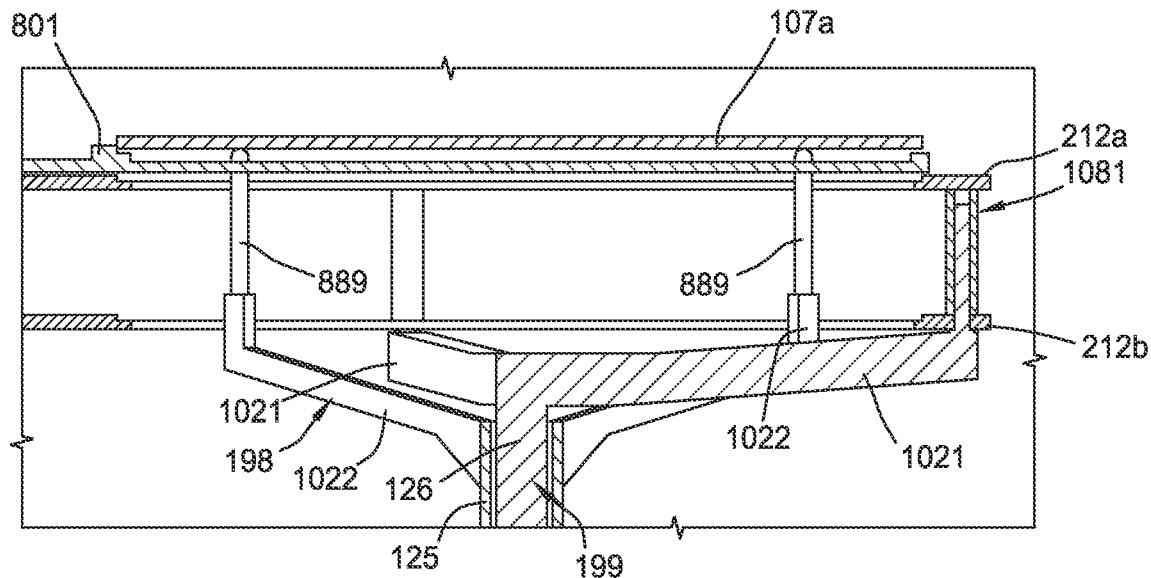
FIGS. 8A-8D show an operation flow (from a partial schematic side view) of transferring two substrates onto a cassette in a processing chamber, according to one implementation.

In FIG. 8A, a robot blade 801 has been extended into the processing chamber above a first substrate support 212A, and the second support frame 198 has been raised such that lift pins 889 engage and lift a first substrate 107A from the robot blade 801. The lift pins 889 can directly engage the first substrate 107A, or the lift pins 889 can indirectly engage the first substrate 107A using a structure between the lift pins 889 and the first substrate 107A.

Figure 8B:
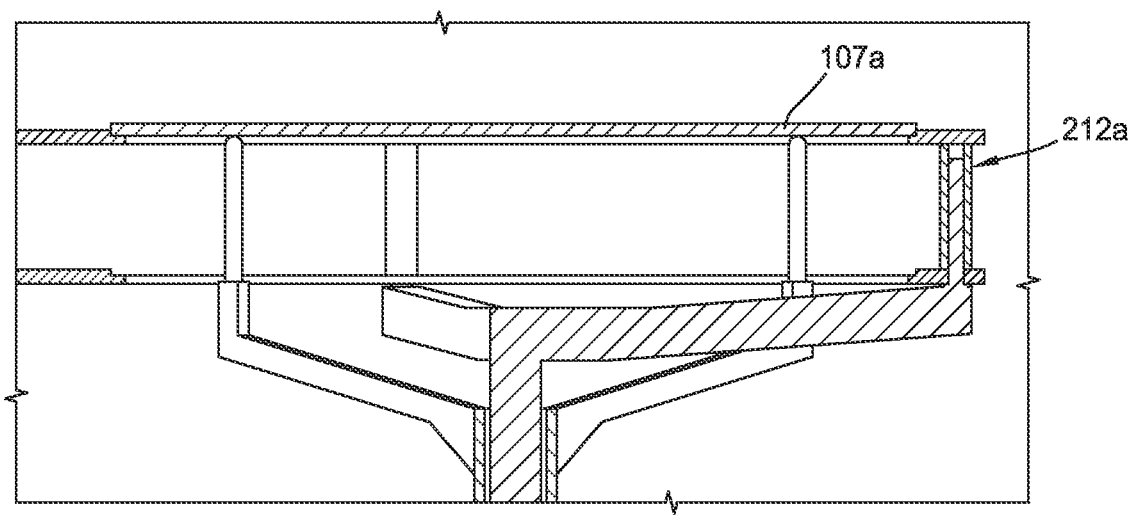

In FIG. 8B, the robot blade 801 has been retracted from the processing chamber. The second support frame 198 has been lowered to land the first substrate 107A on the first substrate support 212A.

Figure 8C:
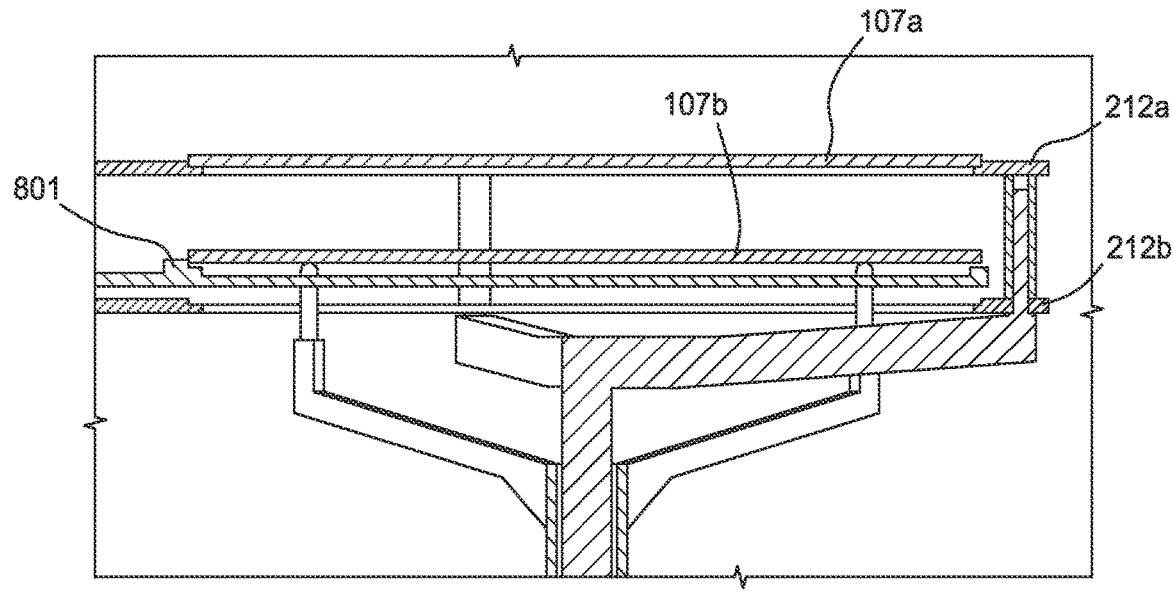

In FIG. 8C, the first support frame 199 has been raised relative to the position shown in FIGS. 8A, 8B, and the robot blade 801 has been extended into the processing chamber above a second substrate support 212B. In FIG. 8C, the second support frame 198 has been raised such that lift pins 889 engage and lift a second substrate 107B from the robot blade 801. The lift pins 889 can directly engage the second substrate 107B, or the lift pins 889 can indirectly engage the second substrate 107B using a structure between the lift pins 889 and the second substrate 107B.

Figure 8D:
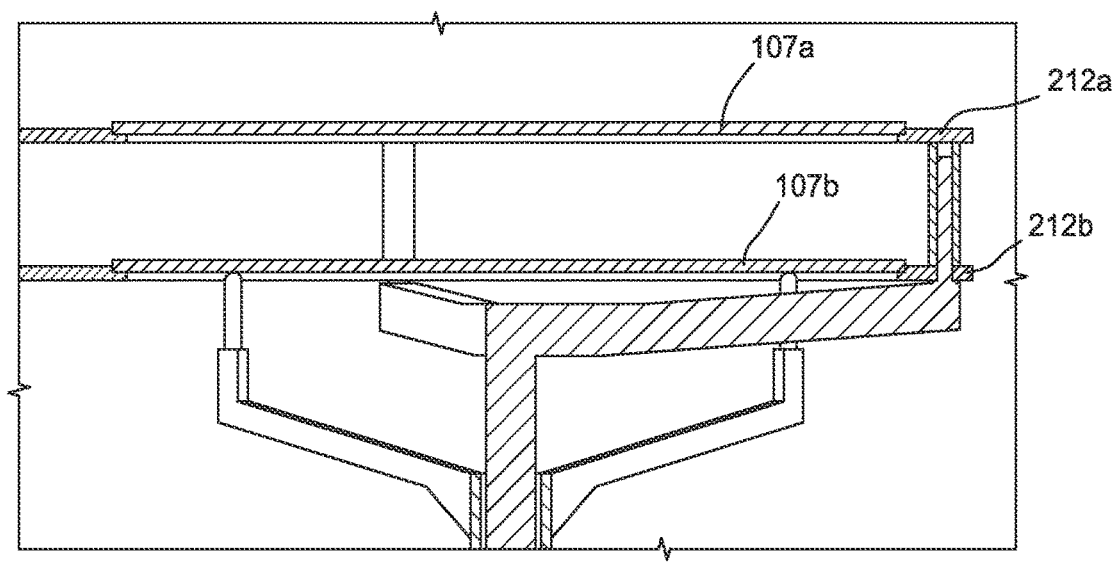

In FIG. 8D, the robot blade 801 has been retracted from the processing chamber. The second support frame 198 has been lowered to land the second substrate 107B on the second substrate support 212B.

Benefits of the present disclosure include independently moving support blocks and corresponding support frames at any given point in time, in any sequence, and at any linear position (e.g., within ranges allowed by stops-if used); increased throughput; reduced machine downtime; and quickly loading and unloading substrates from cassettes for batch substrate processing operations. The three motors described herein can be used independently to do one, some, or all of the following at any point in time and at any linear location: linearly move the first support frame 199, rotate the first support frame 199, and/or linearly move the second support frame 198. One of the two support frames 198, 199 can be raised or lowered without first raising or lowering the other of the two support frames 198, 199.

As an example, the second support frame 198 can be raised and lowered while the first support frame 199 is stationary, and the first support frame 199 can be raised and lowered while the second support frame 198 is stationary. As another example, the first support frame 199 and the second support frame 198 can be raised and lowered simultaneously. Such modularity in independent movement facilitates a variety of movement sequences of the support frames 198, 199 to facilitate methods (such as the method 700) that quickly and simply load and unload a plurality of substrates to and from a cassette for batch processing.

It is contemplated that aspects described herein can be combined. For example, one or more features, aspects, components, operations, and/or properties of the processing apparatus 100, the cassette 1030, the lift assembly 300, the method 700, and/or the cassette shown in FIGS. 7A-7D can be combined. It is further contemplated that any combination(s) can achieve the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A lift assembly for disposition in relation to a substrate processing chamber, the lift assembly comprising:
   a first motor;
   a first drive assembly comprising:
      a first drive shaft coupled to the first motor, the first motor configured to rotate the first drive shaft,
      a first support block coupled to the first drive assembly, the first motor configured to linearly move the first support block using the first drive assembly, and
      a first traveling block disposed along the first drive shaft, the first traveling block coupled to the first support block;
   a second motor;
   a second drive assembly coupled to the second motor;
   a second support block coupled to the second drive assembly, the second motor configured to linearly move the second support block using the second drive assembly, the second motor configured to linearly move the second support block independently of the first motor linearly moving the first support block;
   a support beam; and
   a mount block coupled to the support beam, wherein each of the first motor and the second motor is coupled to the mount block.

2. The lift assembly of claim 1, wherein:
   the second drive assembly comprises:
      a second drive shaft coupled to the second motor, wherein the second motor is configured to rotate the second drive shaft, and
      a second traveling block disposed along the second drive shaft, wherein the second traveling block is coupled to the second support block.

3. The lift assembly of claim 2, wherein:
   the first drive shaft is a first lead screw, and a first threaded interface is between the first lead screw and the first traveling block; and
   the second drive shaft is a second lead screw, and a second threaded interface is between the second lead screw and the second traveling block.

4. The lift assembly of claim 1, wherein the support beam comprises one or more tracks interfacing with the first support block.

5. The lift assembly of claim 4, wherein the one or more tracks are one or more openings formed in the support beam, and the first support block comprises one or more first legs that extend through the one or more tracks and couple to the first traveling block.

6. The lift assembly of claim 2, wherein the second support block comprises one or more legs that couple to the second traveling block.

7. The lift assembly of claim 1, further comprising a third motor coupled to the first support block.

8. The lift assembly of claim 7, wherein:
the first support block supports a first shaft of a first support frame such that linear movement of the first support block linearly moves the first support frame;
the second support block supports a second shaft of a second support frame such that linear movement of the second support block linearly moves the second support frame; and
the third motor is configured to rotate the first shaft of the first support frame.

9. An apparatus for substrate processing, comprising:
a chamber body comprising:
  a processing volume,
  a plurality of gas inject passages formed in the chamber body, and
  one or more gas exhaust passages formed in the chamber body;
one or more heat sources configured to generate heat;
a substrate support assembly positioned in the processing volume, the substrate support assembly comprising:
  a plurality of lift pins,
  one or more substrate supports,
  a first support frame comprising a first shaft and a plurality of first arms, the plurality of first arms configured to interface with the plurality of lift pins, and
  a second support frame comprising a second shaft and a plurality of second arms, the plurality of second arms configured to support the one or more substrate supports; and
a lift assembly comprising:
  a first motor,
  a first support block coupled to the first motor and the first shaft of the first support frame, the first motor configured to linearly move the first support block and the first support frame,
  a second motor,
  a second support block coupled to the second motor and the second shaft of the second support frame, the second motor configured to linearly move the second support block and the second support frame independently of the first motor linearly moving the first support block and the first support frame
  a support beam, and
  a mount block coupled to the support beam, wherein each of the first motor and the second motor is coupled to the mount block.

10. The apparatus of claim 9, further comprising:
a first drive assembly coupled to the first motor and the first support block, wherein the first motor is configured to linearly move the first support block and the first support frame using the first drive assembly; and
a second drive assembly coupled to the second motor and the second support block, wherein the second motor is configured to linearly move the second support block and the second support frame using the second drive assembly.

11. The apparatus of claim 10, wherein:
the first drive assembly comprises:
  a first drive shaft coupled to the first motor, wherein the first motor is configured to rotate the first drive shaft, and
  a first traveling block disposed along the first drive shaft, wherein the first traveling block is coupled to the first support block; and the second drive assembly comprises:
  a second drive shaft coupled to the second motor, wherein the second motor is configured to rotate the second drive shaft, and
  a second traveling block disposed along the second drive shaft, wherein the second traveling block is coupled to the second support block.

12. The apparatus of claim 11, further comprising a third motor coupled to the first support block.

13. The apparatus of claim 12, wherein:
linear movement of the first traveling block linearly moves the first support block and the first support frame;
linear movement of the second traveling block linearly moves the second support block and the second support frame; and
the third motor is configured to rotate the first shaft of the first support frame.

14. A method of transferring substrates, comprising:
moving a first substrate into a chamber;
raising a second support frame relative to a first support frame to engage the first substrate, the first support frame comprising a first shaft and a plurality of first arms, and the second support frame comprising a second shaft and a plurality of second arms;
lowering the second support frame relative to the first support frame to land the first substrate on a first substrate support;
raising the first support frame;
moving a second substrate into the chamber;
raising the second support frame relative to the first support frame to engage the second substrate; and
lowering the second support frame relative to the first support frame to land the second substrate on a second substrate support.

15. The method of claim 14, wherein the second support frame is raised at least partially simultaneously with the raising of the first support frame.

16. The method of claim 14, wherein the raising of the second support frame to engage the first substrate comprises:
the plurality of second arms raising a plurality of lift pins that engage the first substrate.

17. The method of claim 14, further comprising:
raising the first support frame into a processing position;
processing the first substrate and the second substrate; and
lowering the first support frame.

18. The method of claim 17, further comprising:
raising the second support frame relative to the first support frame to engage the second substrate;
lowering the second support frame relative to the first support frame to disengage the second substrate;
moving the second substrate out of the chamber;
lowering the first support frame;
raising the second support frame relative to the first support frame to engage the first substrate;
lowering the second support frame relative to the first support frame to disengage the first substrate; and
moving the first substrate out of the chamber.

19. The method of claim 14, wherein the second support frame is lowered at least partially simultaneously with the lowering of the first support frame.

* * * * *

UNITED STATES PATENT AND TRADEMARK OFFICE
CERTIFICATE OF CORRECTION

PATENT NO. : 12,428,753 B2
APPLICATION NO. : 18/106155
DATED : September 30, 2025
INVENTOR(S) : Aniketnitin Patil et al.

Page 1 of 1

It is certified that error appears in the above-identified patent and that said Letters Patent is hereby corrected as shown below:

In the Claims

In Column 14, Line 60, in Claim 5, delete "first legs" and insert -- legs --.

Signed and Sealed this
Twenty-third Day of December, 2025

John A. Squires
*Director of the United States Patent and Trademark Office*